United States Patent
Peng et al.

(10) Patent No.: US 10,062,994 B2
(45) Date of Patent: Aug. 28, 2018

(54) ELECTRICAL CONNECTOR

(71) Applicant: LOTES CO., LTD, Keelung (TW)

(72) Inventors: Jian Min Peng, Keelung (TW); Ming Jui Tsai, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/677,295

(22) Filed: Aug. 15, 2017

(65) Prior Publication Data
US 2018/0212387 A1 Jul. 26, 2018

Related U.S. Application Data

(60) Provisional application No. 62/449,183, filed on Jan. 23, 2017.

(30) Foreign Application Priority Data

Apr. 13, 2017 (CN) .......................... 2017 1 0237888

(51) Int. Cl.
*H01R 12/88* (2011.01)
*H01R 33/97* (2006.01)

(52) U.S. Cl.
CPC ............. *H01R 12/88* (2013.01); *H01R 33/97* (2013.01)

(58) Field of Classification Search
CPC ........................... H01R 12/88; H01R 13/62944
See application file for complete search history.

(56) References Cited

U.S. PATENT DOCUMENTS

| 8,506,316 | B2* | 8/2013 | Tsai | H05K 7/1061 |
| | | | | 439/331 |
| 9,048,585 | B2* | 6/2015 | Lin | G02B 6/00 |
| 9,466,900 | B1* | 10/2016 | Heng | H05K 3/32 |
| 9,717,156 | B2* | 7/2017 | Zhang | H05K 7/00 |
| 9,867,302 | B2* | 1/2018 | Zhang | H05K 7/00 |
| 2007/0259543 | A1* | 11/2007 | Hsieh | G01R 1/0466 |
| | | | | 439/73 |

(Continued)

FOREIGN PATENT DOCUMENTS

| CN | 1761109 A | 4/2006 |
| CN | 201887186 U | 6/2011 |

(Continued)

*Primary Examiner* — James Harvey
(74) *Attorney, Agent, or Firm* — Locke Lord LLP; Tim Tingkang Xia, Esq.

(57) ABSTRACT

An electrical connector used for bearing a chip module includes an insulating body, terminals arranged in the insulating body, a carrying member, for carrying the chip module to the insulating body, disposed at one side of the insulating body and contacting with the terminals, a pressing plate for pressing the carrying member or the chip module, and an elastic member having at least two limiting portions. The pressing plate and the carrying member are separately disposed at two adjacent sides on the periphery of the insulating body. The two limiting portions define a pivoting space, and the carrying member is pivotally connected to the pivoting space. The elastic member and the carrying member are disposed at the same side of the insulating body, the elastic member has a buffer portion, and the buffer portion abuts against the carrying member and is disposed between the insulating body and the carrying member.

19 Claims, 21 Drawing Sheets

(56) References Cited

U.S. PATENT DOCUMENTS

| | | | | |
|---|---|---|---|---|
| 2012/0142209 A1* | 6/2012 | Yeh | ............ | H01R 12/88 439/345 |
| 2012/0156919 A1* | 6/2012 | Yeh | ............ | H01R 12/88 439/370 |
| 2013/0322037 A1* | 12/2013 | Tan | ............ | H05K 7/10 361/752 |
| 2013/0344713 A1* | 12/2013 | Yeh | ............ | H01R 12/88 439/68 |
| 2014/0011377 A1* | 1/2014 | Yeh | ............ | H01R 13/62933 439/73 |
| 2017/0104286 A1* | 4/2017 | Heng | ............ | H01R 12/88 |

FOREIGN PATENT DOCUMENTS

| | | |
|---|---|---|
| CN | 201966435 U | 9/2011 |
| CN | 103490208 A | 1/2014 |
| CN | 204088690 U | 1/2015 |
| CN | 205488736 U | 8/2016 |

* cited by examiner

ELECTRICAL CONNECTOR

CROSS-REFERENCE TO RELATED APPLICATION

This non-provisional application claims priority to and the benefit of, under 35 U.S.C. § 119(e), U.S. provisional patent application Ser. No. 62/449,183, filed Jan. 23, 2017, and under 35 U.S.C. § 119(a), Patent Application No. 201710237888.4 filed in P.R. China on Apr. 13, 2017, the entire content of which is hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector for bearing a chip module.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector for bearing a chip module includes an insulating body, multiple terminals fixedly arranged in the insulating body, a carrier disposed at one side of the insulating body and used for carrying the chip module to contact with the multiple terminals, a pressing plate used for pressing the carrier until the chip module contacts with the multiple terminals, where the pressing plate and the carrier are disposed at the same side or separately disposed at two opposite sides, and a buffer mechanism for buffering downward pressing of the carrier.

When the pressing plate and the carrier are disposed at the same side, an assembly space of the chip module is small, so the assembling difficulty is high. When the pressing plate and the carrier are separately disposed at two opposite sides, an assembly space of a lever is small, so the operation is inconvenient. Regardless of whether the pressing plate and the carrier are disposed at the same side or at two opposite sides, a length of the electric connector will be increased, thereby occupying more area of a circuit board. Meanwhile, when the carrier carrying the chip module is downward pressed, a downward pressing force of the carrier is relatively large, resulting in direct smashing of the chip module over the terminals on the insulating body to cause the damage to the terminals. And therefore, with the increasing miniaturization of electronic products nowadays, the market has an urgent need of a smaller electric connector with more complete functions.

Therefore, it is necessary to design an improved electrical connector, so as to overcome the foregoing problems.

SUMMARY OF THE INVENTION

The present invention is directed to an electrical connector in which a carrying member and a pressing plate are arranged at two adjacent sides on the periphery of an insulating body to reduce the area of the electrical connector, and save the space on a circuit board.

To achieve the foregoing objective, the present invention uses the following technical means.

In one aspect, an electrical connector is used for bearing a chip module, and includes an insulating body, multiple terminals arranged in the insulating body, a carrying member disposed at one side of the insulating body and used for carrying the chip module to the insulating body, where the chip module contacts with the multiple terminals, and a pressing plate used for pressing the carrying member or the chip module, where the pressing plate and the carrying member are separately disposed at two adjacent sides on the periphery of the insulating body.

In certain embodiments, the carrying member has two opposite long sides and two opposite short sides, one long side of the carrying member is used as a pivoting side. The pressing plate has two opposite long sides and two opposite short sides, and one short side of the pressing plate is used as a pivoting side.

In certain embodiments, the carrying member is pivotally connected to the insulating body.

In certain embodiments, two ends of the pivoting side of the carrying member respectively have a pivoting shaft. The insulating body has two fixed holes, and the pivoting shafts are pivotally connected to the fixed holes.

In certain embodiments, an elastic member and the carrying member are disposed at the same side of the insulating body, the elastic member has a buffer portion, and the buffer portion abuts against the carrying member.

In certain embodiments, the elastic member has a main body portion, the buffer portion extends from the main body portion, and the buffer portion is disposed between the insulating body and the carrying member.

In certain embodiments, the carrying member is concavely provided with a matching portion, and the engaging portion abuts against the buffer portion.

In certain embodiments, an elastic member has a main body portion. At least one first elastic portion and at least one second elastic portion extend from the main body portion, and a buffer portion extends from the second elastic portion.

In certain embodiments, the main body portion bends downward to form at least one bending portion. The first elastic portion and the second elastic portion horizontally extend from the bending portion, a bearing portion bends upward from the first elastic portion, and the bearing portion upward abuts against the carrying member.

In certain embodiments, the number of the first elastic portions is two, and the second elastic portion is disposed between the two first elastic portions.

In certain embodiments, an elastic member has at least two limiting portions, the two limiting portions define a pivoting space, and the carrying member is pivotally connected to the pivoting space.

In certain embodiments, the two limiting portions are arranged in a staggered manner.

In certain embodiments, the elastic member has a main body portion. At least one first elastic portion and at least one second elastic portion extend from the main body portion, two limiting portions extend from the first elastic portion, and a buffer portion extends from the second elastic portion.

In certain embodiments, the main body portion bends doward to form at least one bending portion, the first elastic portion and the second elastic portion horizontally extend from the bending portion, two limiting portions bend upward from the first elastic portion, and a buffer portion bends upward from the second elastic portion.

In certain embodiments, the carrying member has a pivoting shaft. The pivoting shaft has an assembly plane and a stopping plane which are adjacent to each other, the carrying member has an assembly state and a buffer state, when the carrying member is in the assembly state, the assembly plane abuts against the buffer portion, and when the carrying member is in the buffer state, the stopping plane abuts against the buffer portion.

In certain embodiments, a base is fixed at the periphery of the insulating body, and an elastic member is fixed at the base and disposed at the same side with the carrying member.

In certain embodiments, the elastic member has a main body portion, the main body portion is provided with multiple soldering portions, and the soldering portions fix the elastic member and the base.

In certain embodiments, a base is fixed on the periphery of the insulating body, a first reinforcing member and a second reinforcing member are fixed at the base, and the second reinforcing member is disposed at the opposite side of the first reinforcing member. A first lever is pivotally connected to the first reinforcing member, and a second lever is pivotally connected to the second reinforcing member. The pressing plate is pivotally connected to the first lever, the pressing plate has a protruding portion, and the second lever presses the protruding portion.

In certain embodiments, one side of the carrying member away from the pivoting side has at least one first guide portion, and the at least one first guide portion is adapted to match with an outer wall surface of the insulating body and guide the carrying member to the insulating body.

In certain embodiments, two short sides of the carrying member have at least one second guide portion, and the at least one second guide portion is adapted to match with the outer wall surface of the insulating body and guide the carrying member to the insulating body.

Compared with the related art, the present invention has the following beneficial effects:

In the electrical connector of the present invention, the carrying member and the pressing plate are arranged at two adjacent sides on the periphery of the insulating body, so that compared with the related art where the carrying member and the pressing plate are arranged at the same side or two opposite sides of the insulating body, the length of the electrical connector does not need to increase, thereby enabling the electrical connector to occupy less space of the circuit board, saving the space on the circuit board, and being adaptive to the increasing miniaturization of the electronic products nowadays.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
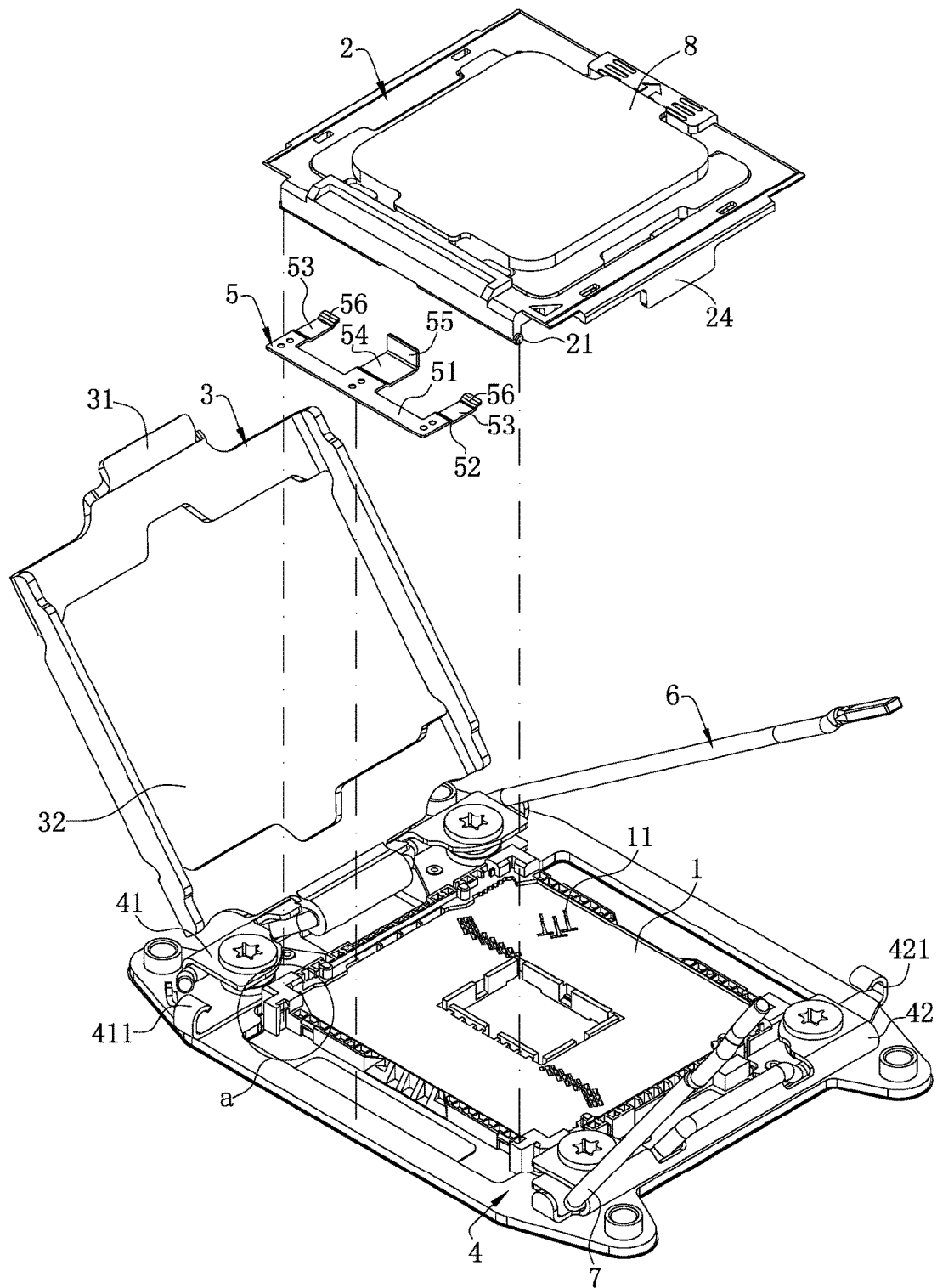
FIG. 1 is a three-dimensional exploded view of an electrical connector according to the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the"

includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" and/or "multiple" means two or more. As used herein, the terms "comprising", "including", "carrying", "having", "containing", "involving", and the like are to be understood to be open-ended, i.e., to mean including but not limited to.

As used herein, the term "module" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The terms "chip" or "computer chip", as used herein, generally refer to a hardware electronic component, and may refer to or include a small electronic circuit unit, also known as an integrated circuit (IC), or a combination of electronic circuits or ICs.

The description will be made as to the embodiments of the present invention in conjunction with the accompanying drawings in FIGS. 1-21. In accordance with the purposes of this invention, as embodied and broadly described herein, this invention, in one aspect, relates to an electrical connector.

Figure 3:
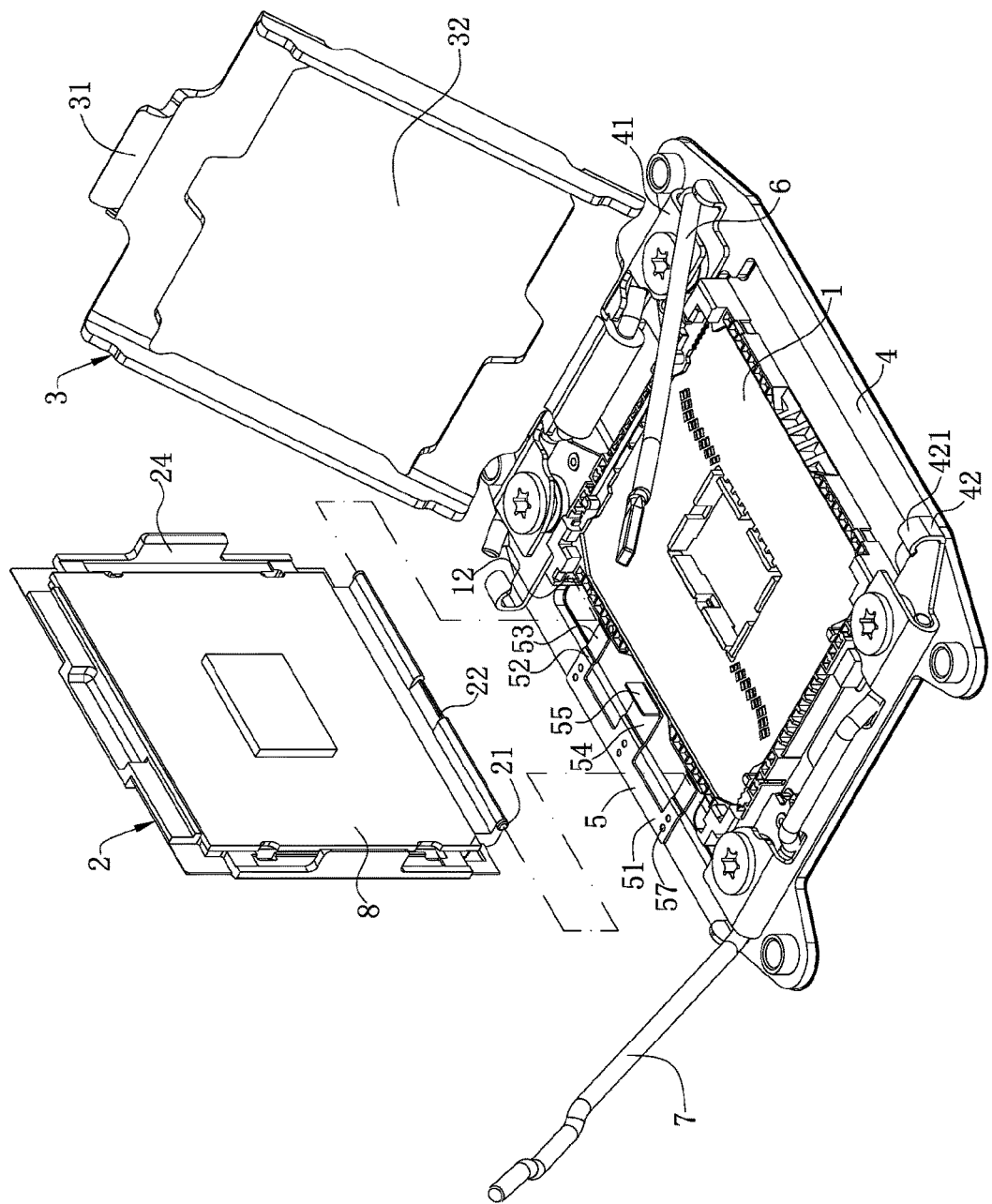
FIG. 3 is a three-dimensional exploded view of the electrical connector from another viewing angle according to the present invention.

As shown in FIG. 1 and FIG. 3, an electrical connector of the present invention is used for bearing a chip module 8, and includes an insulating body 1, multiple terminals 11 arranged in the insulating body 1, a carrying member 2 used for carrying the chip module 8 to the insulating body 1, where the chip module 8 contacts with the multiple terminals 11, a pressing plate 3 used for pressing the carrying member 2 or the chip module 8, where the carrying member 2 and the pressing plate 3 are separately disposed at two adjacent sides on the periphery of the insulating body 1, a base 4 disposed at the periphery of the insulating body 1, and an elastic member 5 fixed on the base 4.

The carrying member 2 has two opposite long sides and two opposite short sides, one long side of the carrying member 2 is used as a pivoting side, the pressing plate 3 has two opposite long sides and two opposite short sides, and one short side of the pressing plate 3 is used as a pivoting side.

Figure 2:
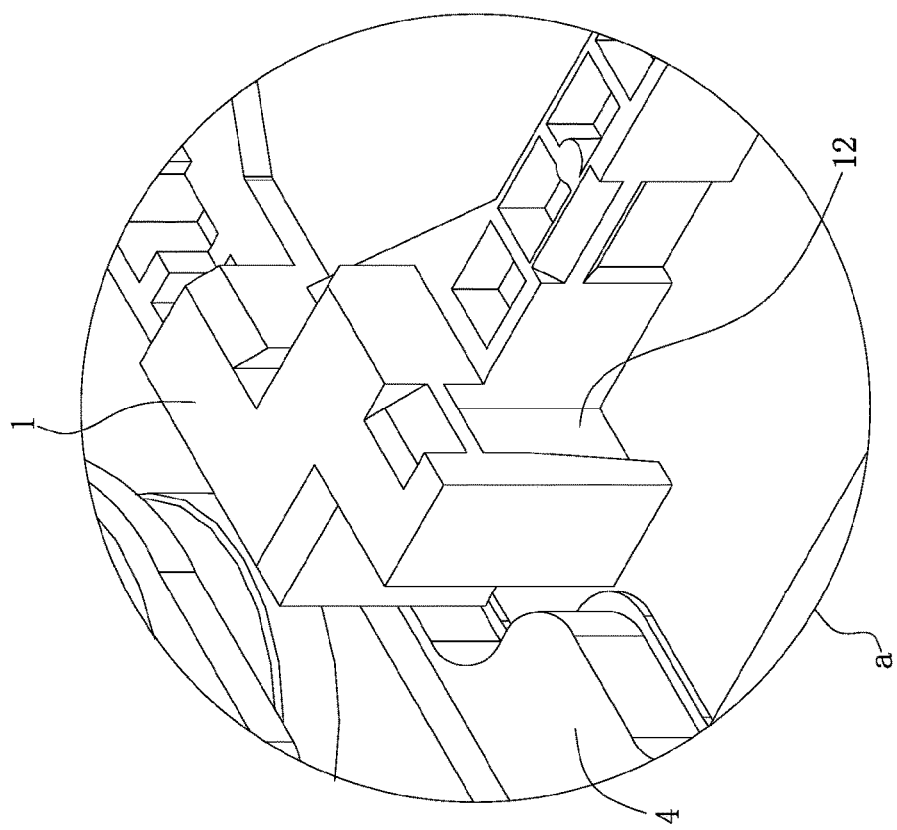
FIG. 2 is an enlarged view of a portion a in FIG. 1.

A first embodiment of the present invention is as shown in FIG. 1 and FIG. 3, the carrying member 2 is pivotally connected to the insulating body 1, two ends of the pivoting side of the carrying member 2 respectively have a pivoting shaft 21, the outer side of the insulating body 1 has two fixed holes 12 (as shown in FIG. 2), and the pivoting shafts 21 are pivotally connected into the fixed holes 12; and each of the two short sides of the carrying member 2 has a first second guide portion 24, each second guide portion 24 has an oblique surface, and the second guide portions 24 are matched with an outer wall of the insulating body 1, and guide the carrying member 2 to pivot to the insulating body 1.

Figure 5:
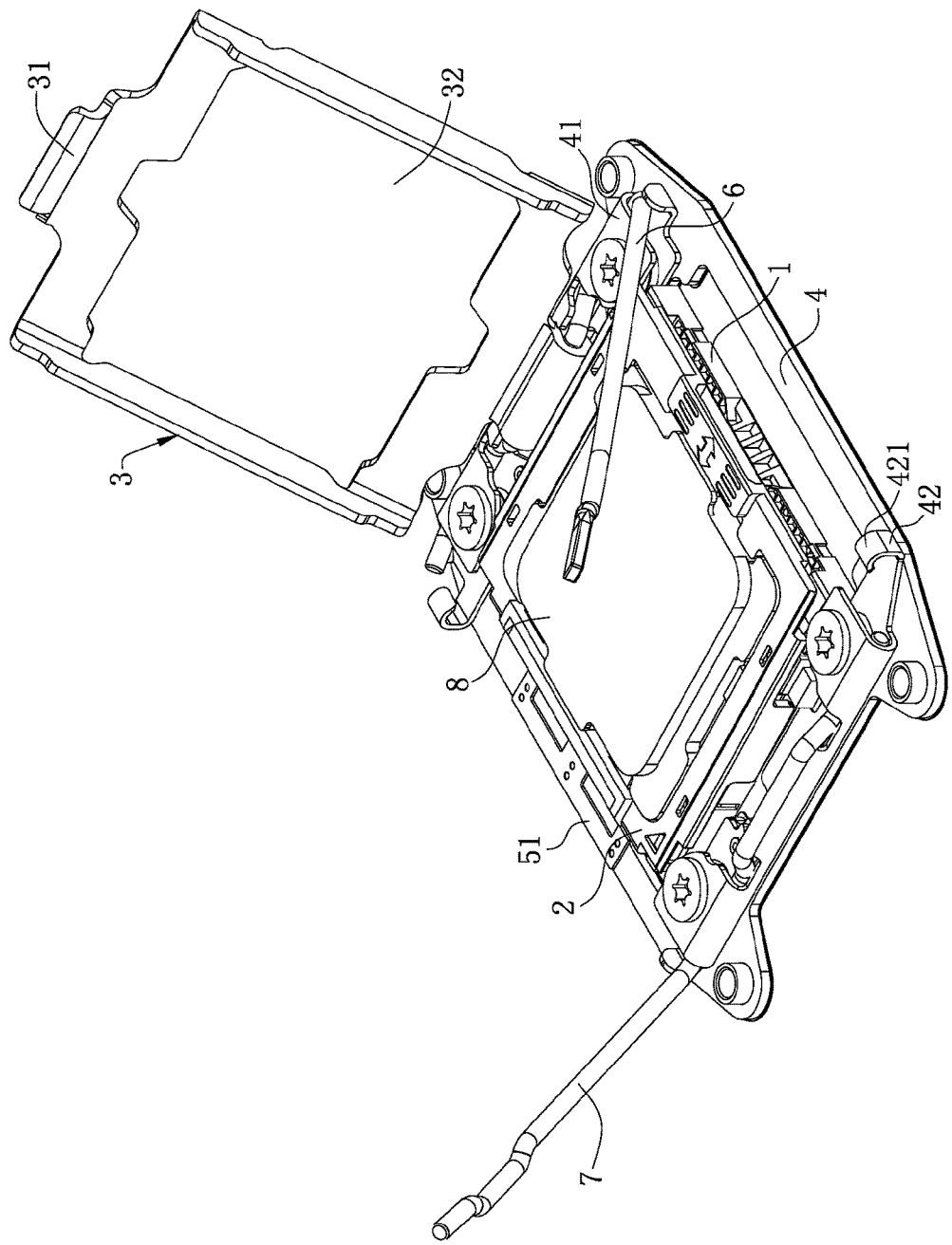
FIG. 5 is a three-dimensional assembled view of the electrical connector in another state according to the present invention.
Figure 6:
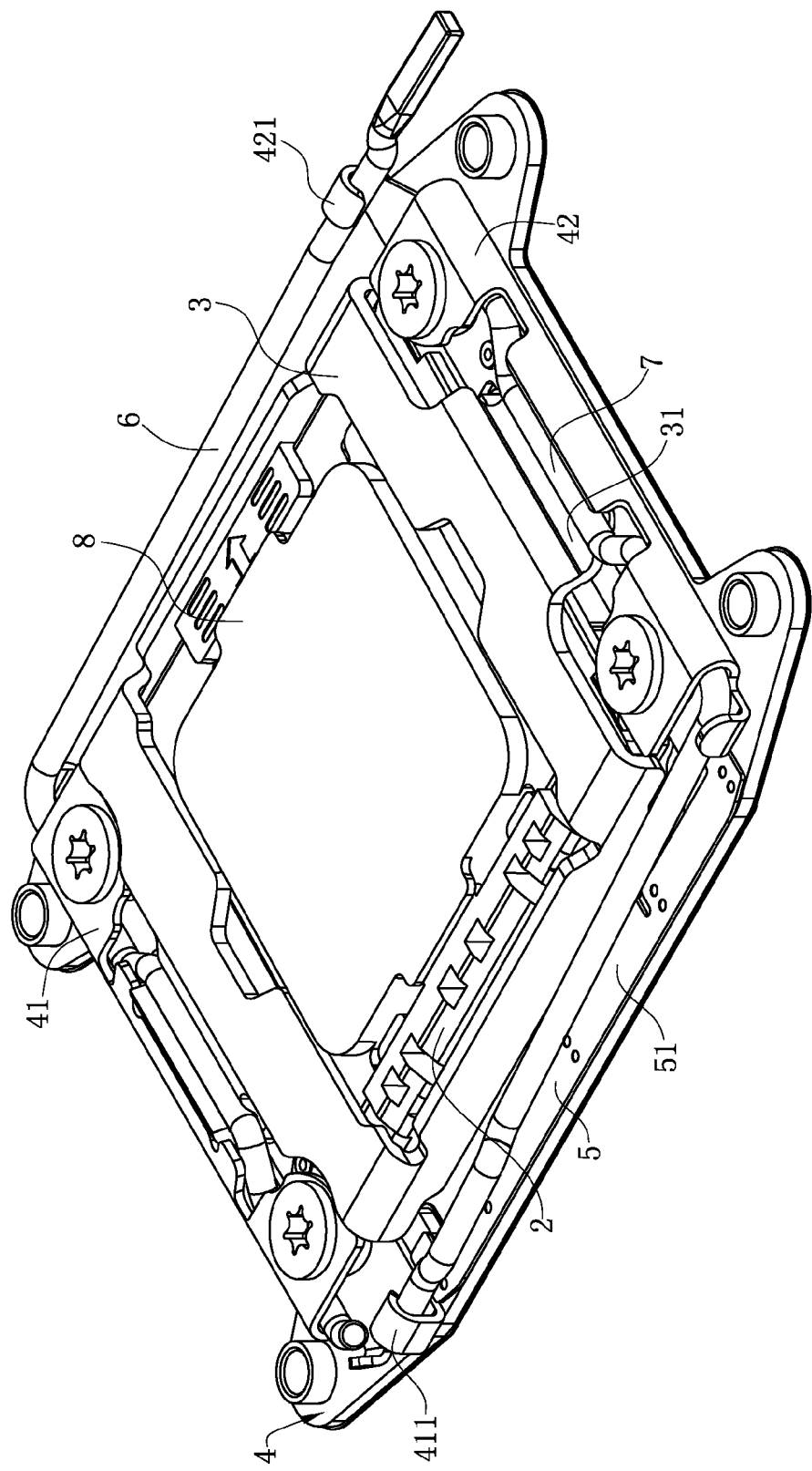
FIG. 6 is a three-dimensional assembled view of the electrical connector in a closed state according to the present invention.

As shown in FIG. 5 and FIG. 6, the opposite side of the pivoting side of the pressing plate 3 has a protruding portion 31, the pressing plate 3 has a frame opening 32, the chip module 8 protrudes upward to be exposed at the frame opening 32, and the pressing plate 3 downward presses the carrying member 2 or the chip module 8.

As shown in FIG. 1 and FIG. 3, the elastic member 5 has a main body portion 51, the main body portion 51 is provided with multiple soldering portions 57, and the soldering portions 57 fix the elastic member 5 and the base 4.

The main body portion 51 bends downward to form three bending portions 52. Two first elastic portions 53 and a second elastic portion 54 horizontally extend from the bending portions 52, and the second elastic portion 54 is disposed between the two first elastic portions 53. A bearing portion 56 bends upward from each of the first elastic portions 53, and the bearing portion 56 upward abuts against the carrying member 2. A buffer portion 55 bends upward from the second elastic portion 54, and the buffer portion 55 is disposed between the insulating body 1 and the carrying member 2. The carrying member 2 is concavely provided with a matching portion 22 corresponding to the buffer portion 55, and the matching portion 22 presses against the buffer portion 55.

Figure 4:
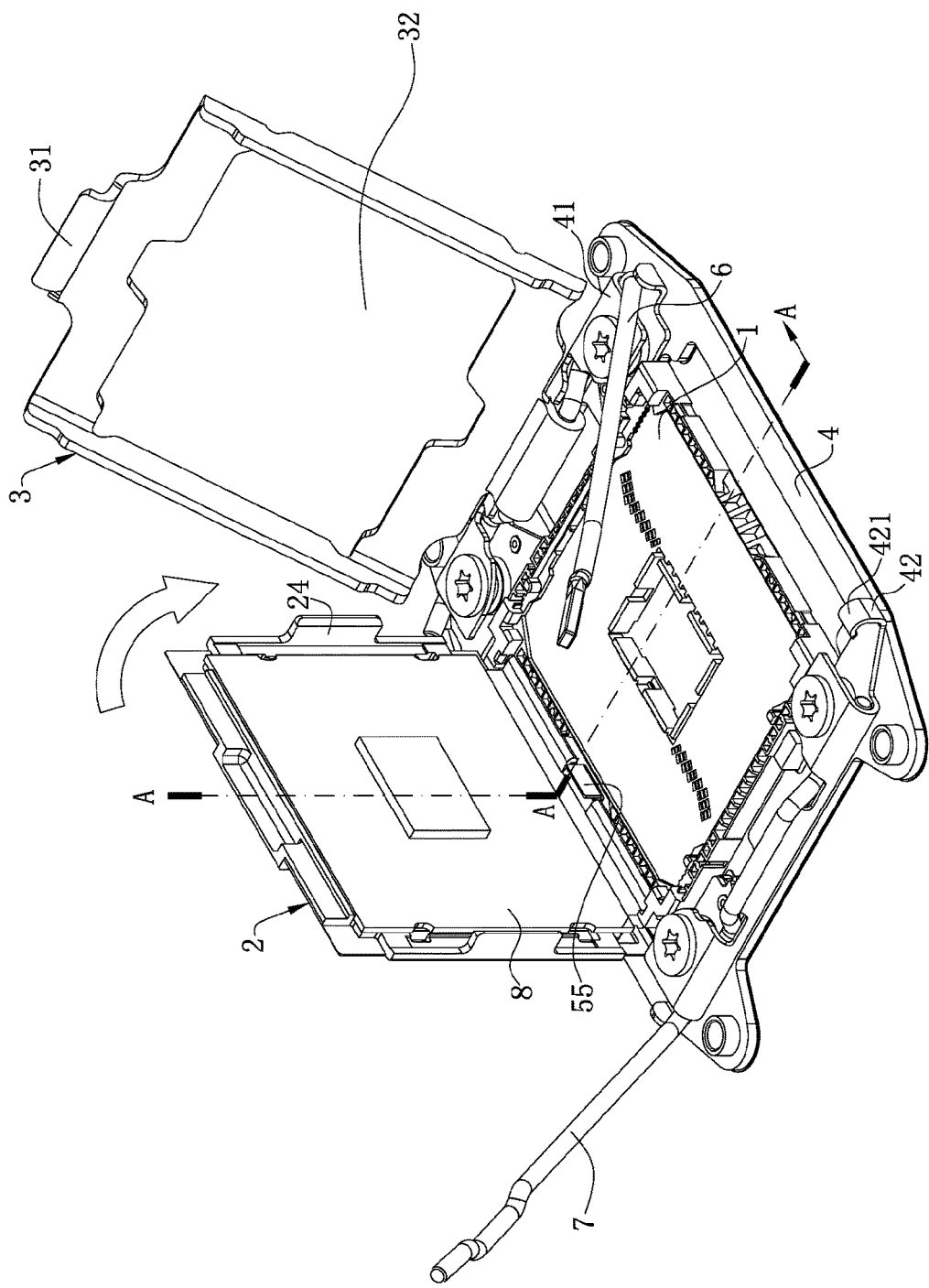
FIG. 4 is a three-dimensional assembled view of the electrical connector according to the present invention.

As shown in FIG. 4 and FIG. 6, a first reinforcing member 41 and a second reinforcing member 42 are fixed at the base 4, the second reinforcing member 42 is disposed at the opposite side of the first reinforcing member 41, a first lever 6 is pivotally connected to the first reinforcing member 41, a second lever 7 is pivotally connected to the second reinforcing member 42, the pressing plate 3 is pivotally connected to the first lever 6, the second lever 7 presses the protruding portion 31, the first reinforcing member 41 has a first hook portion 411, the second reinforcing member 42 has a second hook portion 421, the first lever 6 is hooked at the second hook portion 421, and the second lever 7 is hooked at the first hook portion 411.

Figure 7:
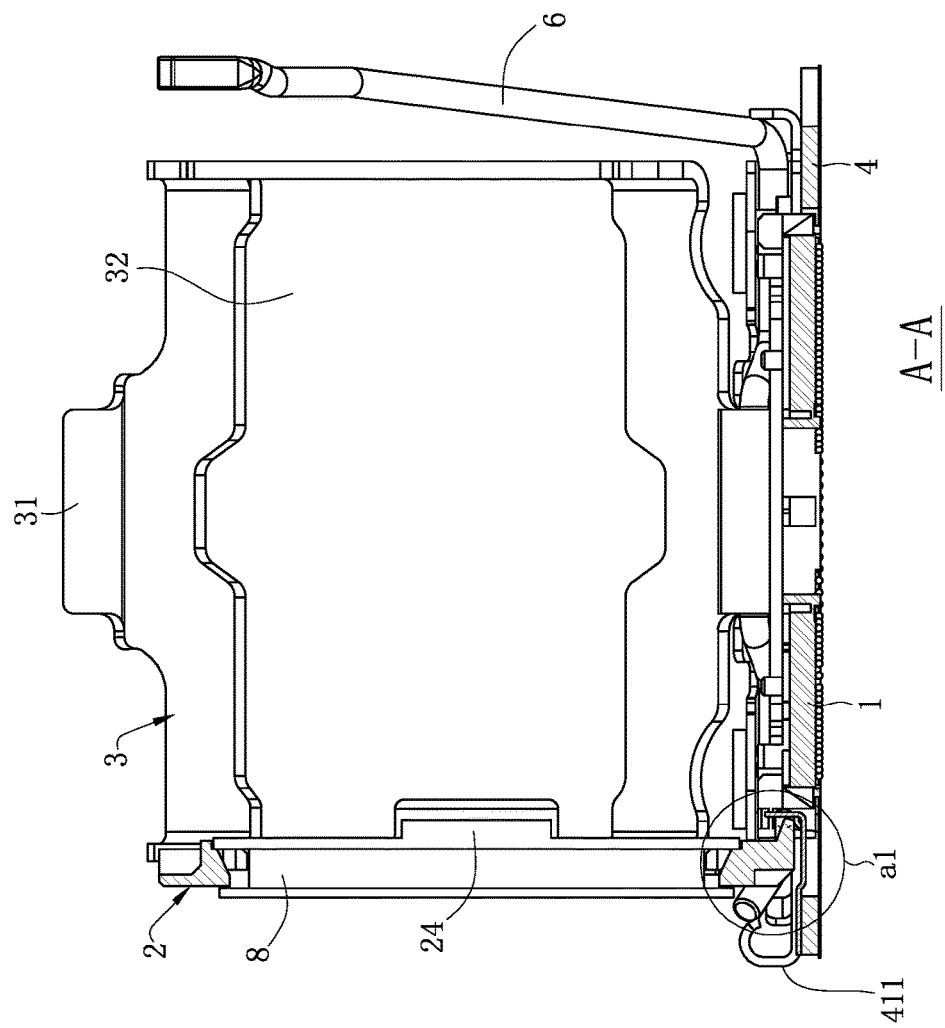
FIG. 7 is a local sectional view of the electrical connector in an assembly state along A-A according to a first embodiment of the present invention.
Figure 8:
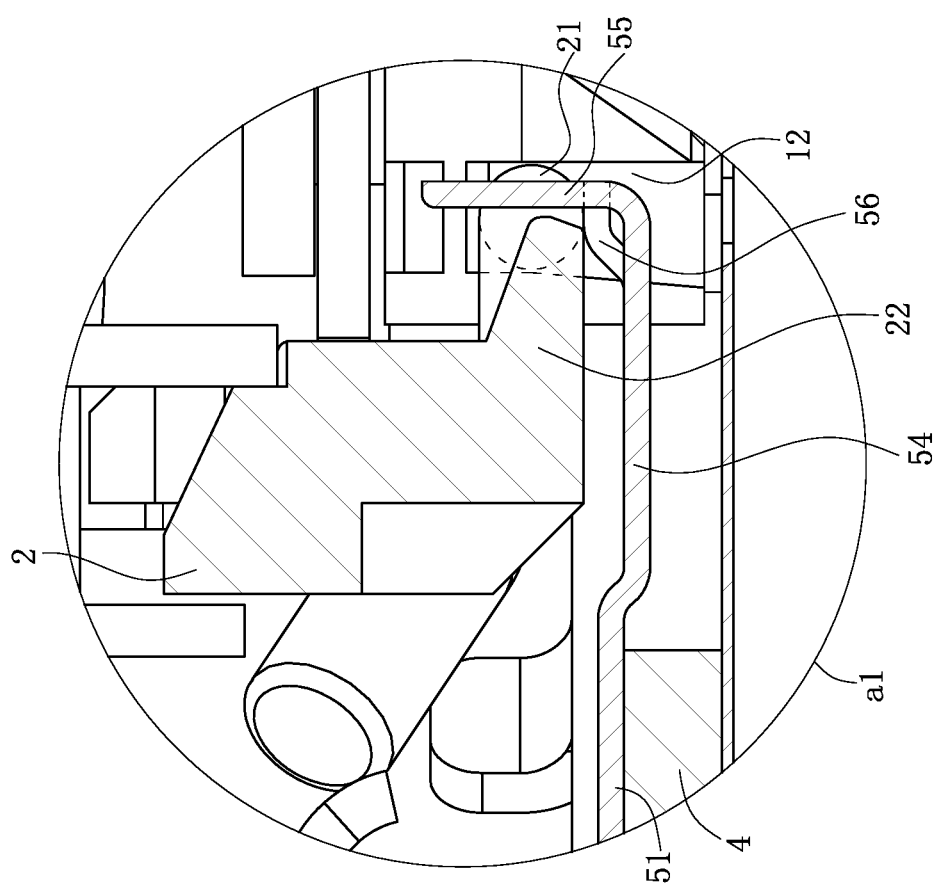
FIG. 8 is a local enlarged view of a portion a1 in FIG. 7.
Figure 9:
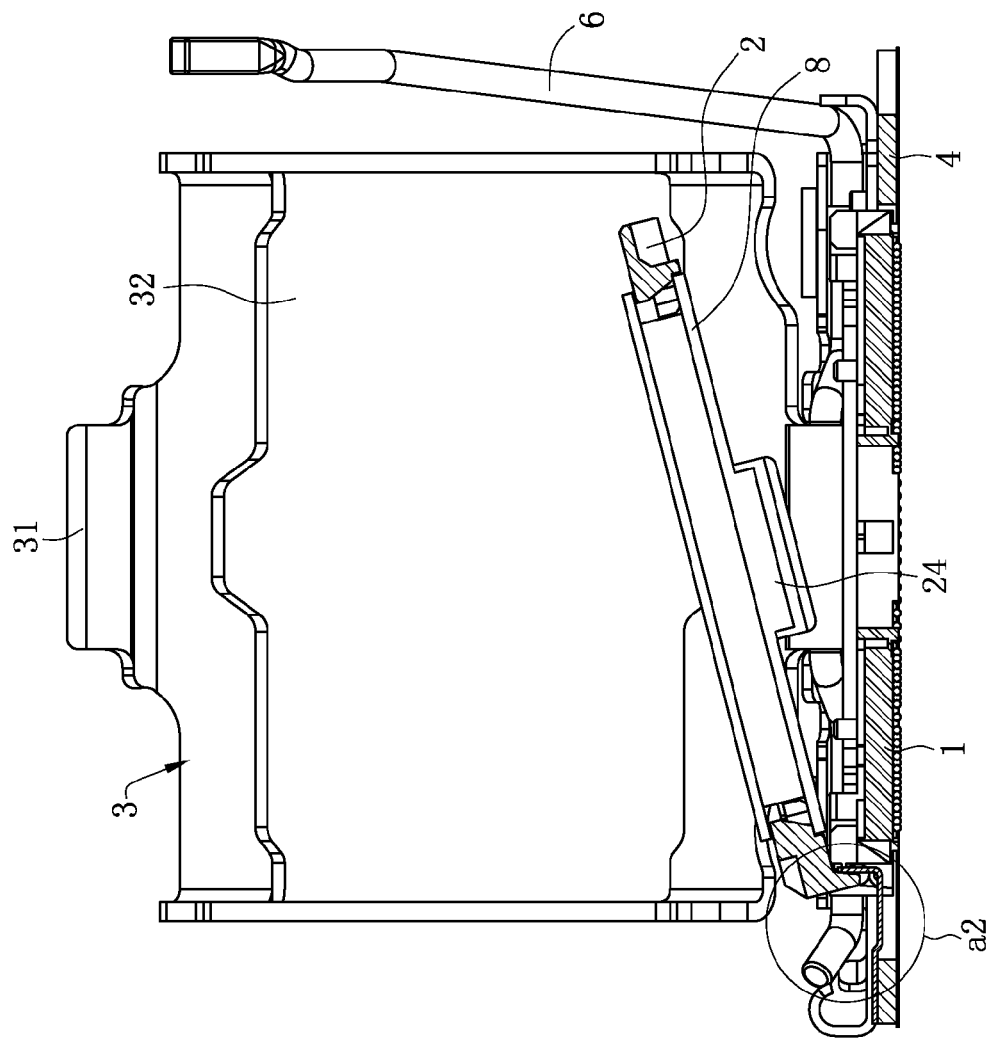
FIG. 9 is a local sectional view of the electrical connector in a buffer state along A-A according to the first embodiment of the present invention.
Figure 10:
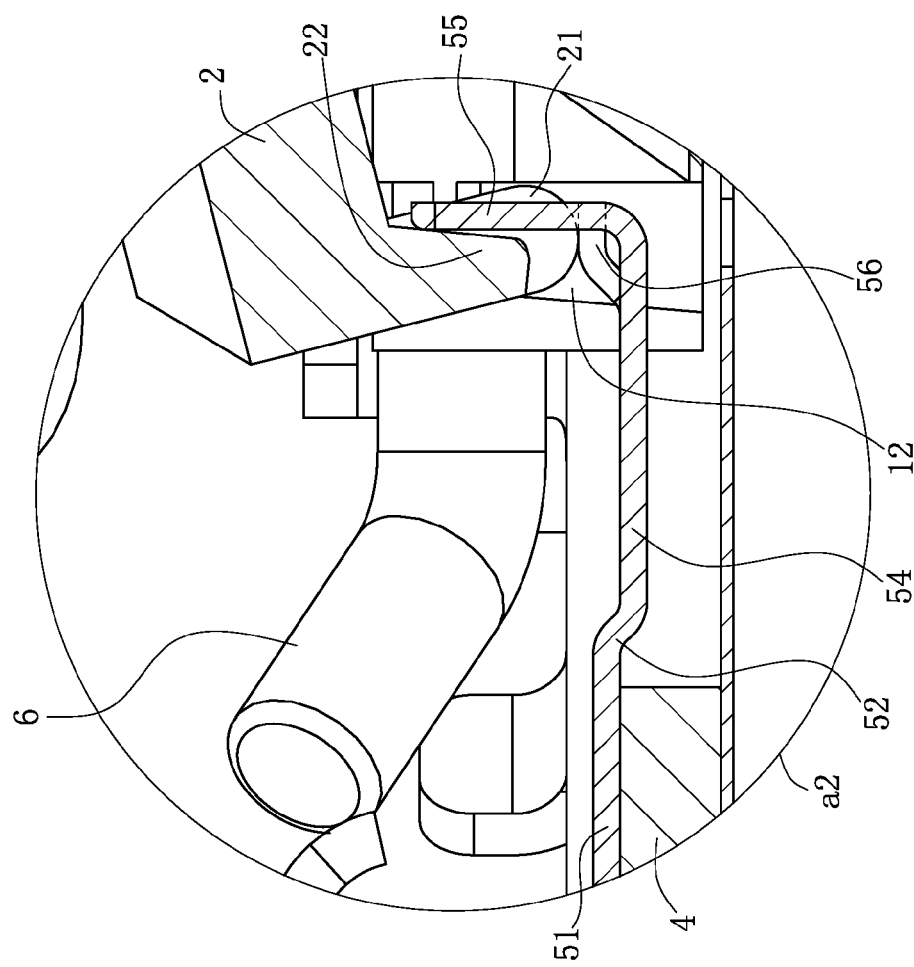
FIG. 10 is a local enlarged view of a portion a2 in FIG. 9.
Figure 11:
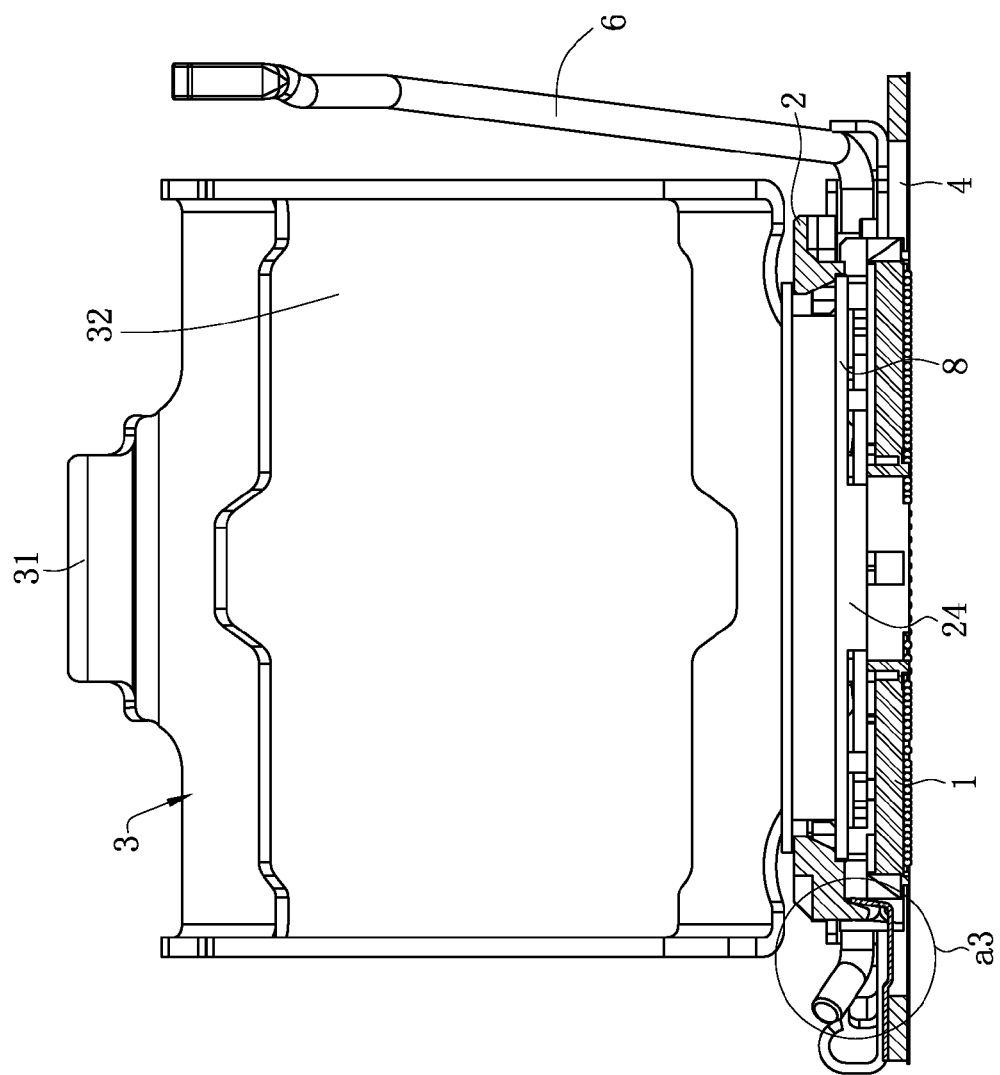
FIG. 11 is a local sectional view of the electrical connector in another state along A-A according to the first embodiment of the present invention.
Figure 12:
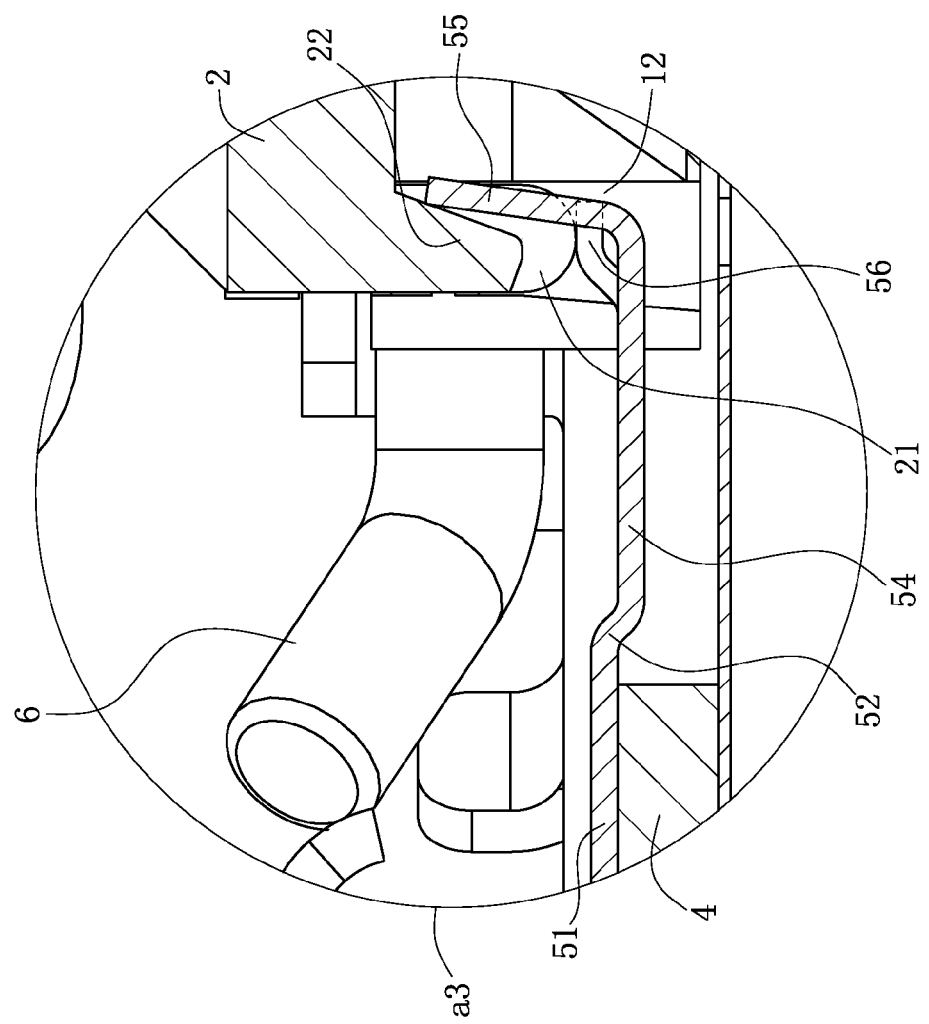
FIG. 12 is a local enlarged view of a portion a3 in FIG. 11.

As shown in FIG. 4, when in operation, the chip module 8 is first mounted into the carrying member 2, at the moment, the electrical connector is in an assembly state (as shown in FIG. 7 and FIG. 8), and the matching portion 22 does not contact with the buffer portion 55. As shown in FIG. 9 and FIG. 10, the carrying member 2 carries the chip module 8 to pivot towards the insulating body 1, when the matching portion 22 contacts with the buffer portion 55, the buffer portion 55 stops the continuous motion of the carrying member 2, and at the moment, the electrical connector is in a buffer state (as shown in FIG. 9 and FIG. 10), thereby preventing the carrying member 2 from suddenly pressing down and smashing the terminals 11. The pressing plate 3 is pressed downward at this moment, the pressing plate 3 downward presses the carrying member 2 or the chip module 8, the matching portion 22 continues to press against the buffer portion 55 to deform the buffer portion 55 (as shown in FIG. 11 and FIG. 12), and at the same time, the carrying member 2 presses against the bearing portion 56, so that the first elastic portion 53 is stressed to downward generate elastic deformation. Then, the second lever 7 is operated such that the second lever 7 is enabled to press the protruding portion 31, and the second lever 7 is hooked at the first hook portion 411. Then, the first lever 6 is operated such that and the first lever 6 is hooked at the second hook portion 421, so that the electrical connector is in a closed state (as shown in FIG. 6). And when the electrical connector is opened, the first lever 6 is first moved out of the second hook portion 421, then the second lever 7 is moved out of the first hook portion 411. At this moment, the pressing plate 3 does not press the carrying member 2 or the chip module 8, and the first elastic portion 53 vertically bounces upward to return to the state before the elastic deformation, i.e., to the buffer state, so that the electrical connector can be in the buffer state or the closed state at any time, and the chip module 8 is moved out of the insulating body 1 without damaging the terminals 11 on the insulating body 1.

Figure 13:
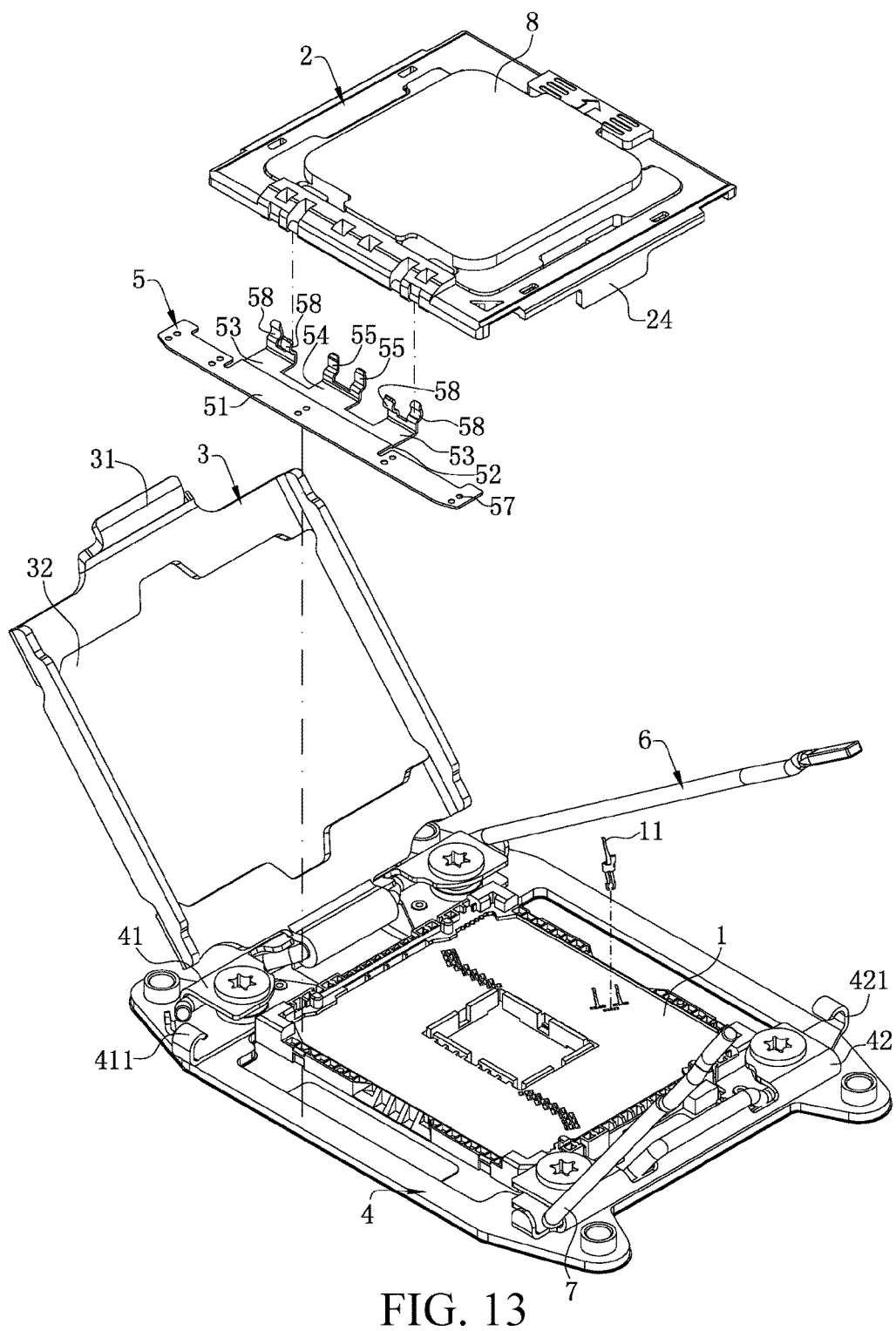
FIG. 13 is a three-dimensional exploded view of the electrical connector according to a second embodiment of the present invention.
Figure 14:
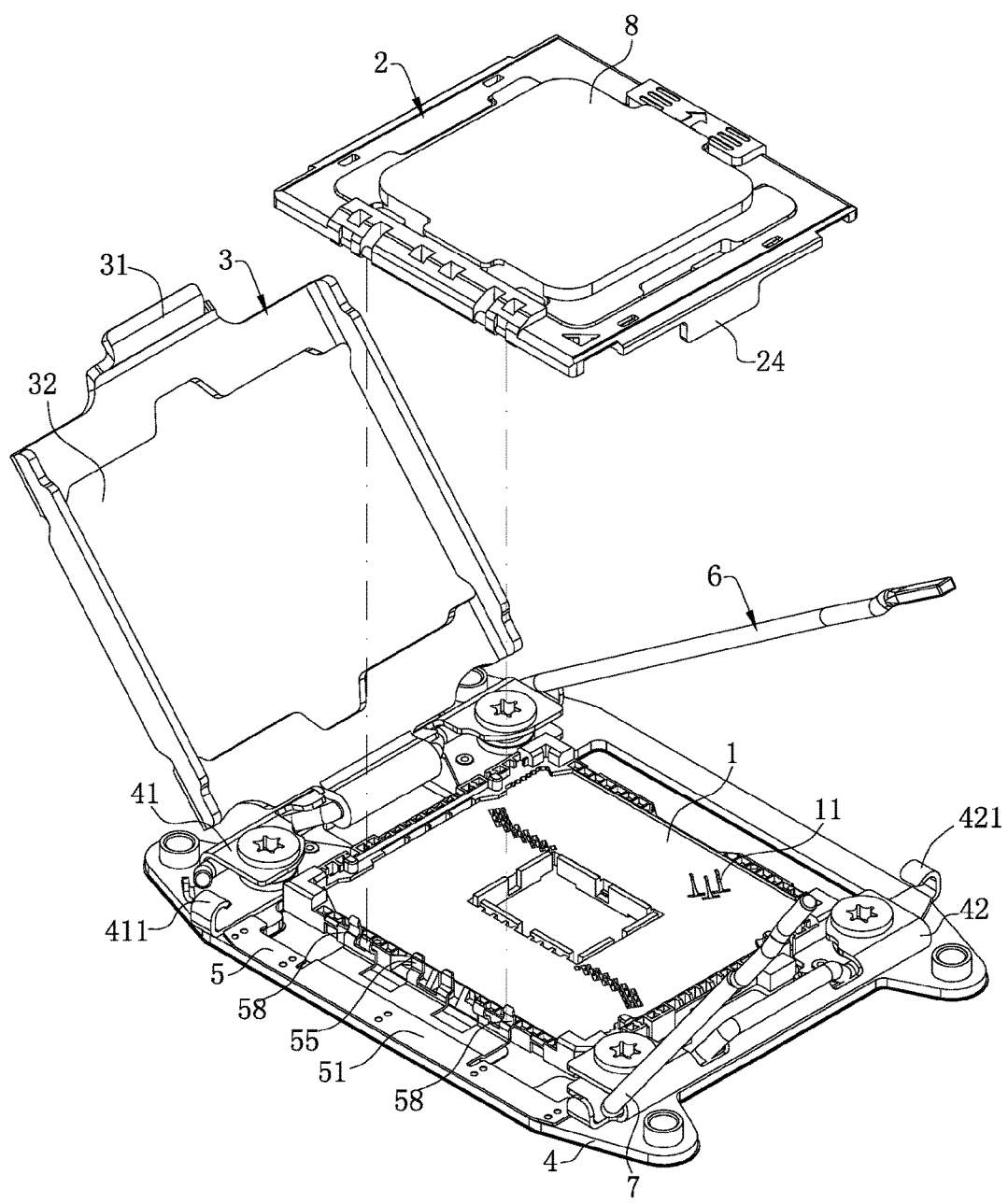
FIG. 14 is a three-dimensional exploded view of the electrical connector from another viewing angle according to the second embodiment of the present invention.
Figure 17:
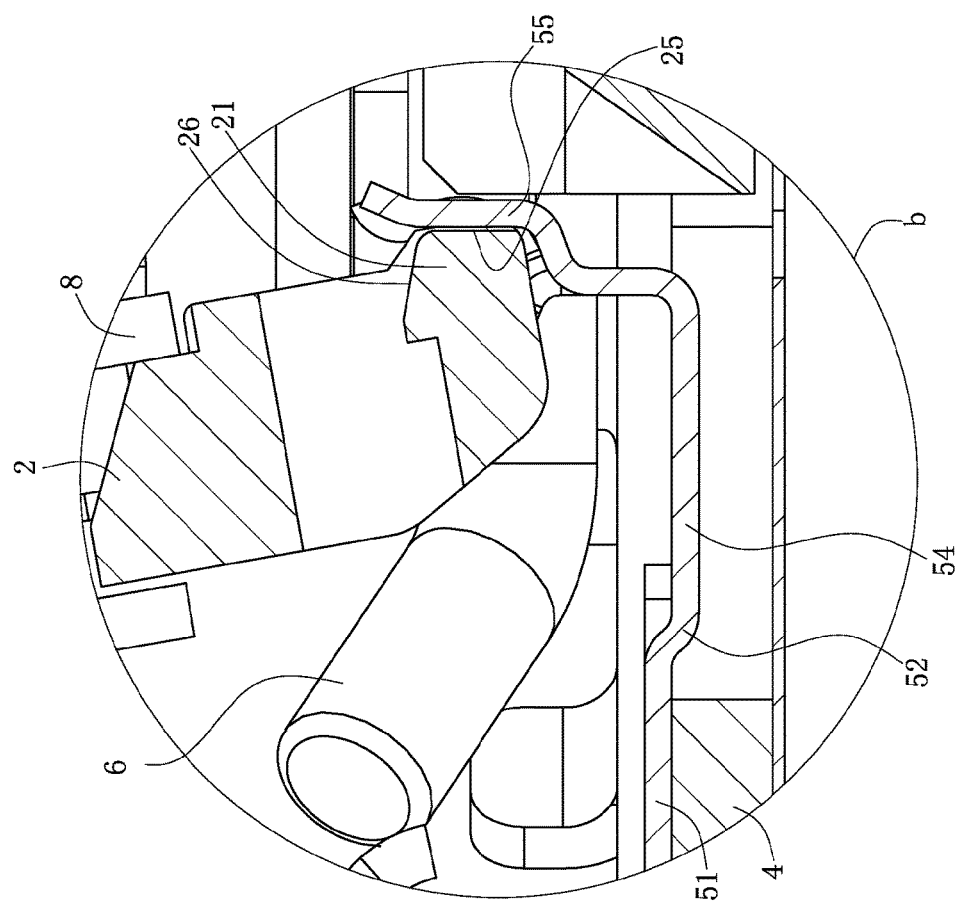
FIG. 17 is a local enlarged view of a portion b in FIG. 16.
Figure 18:
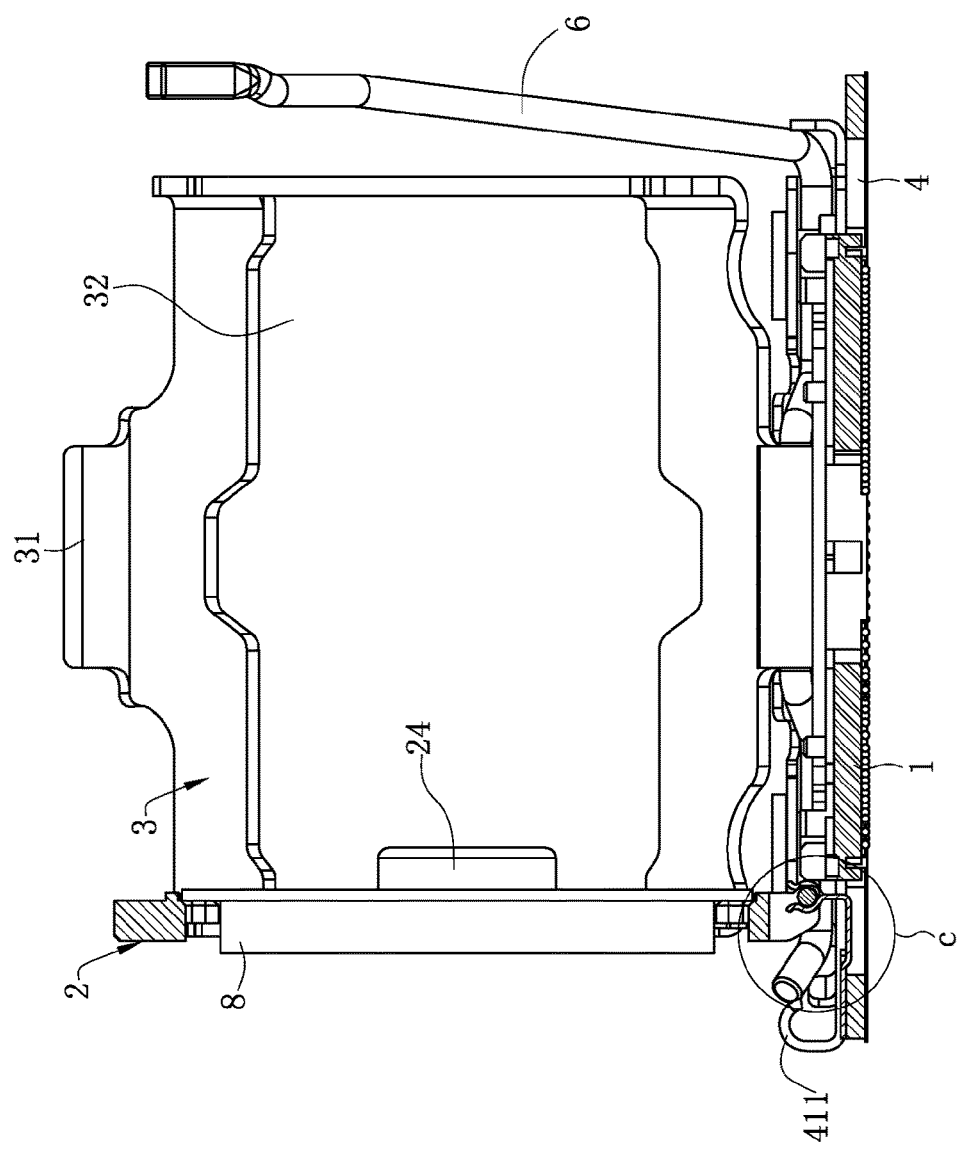
FIG. 18 is a local sectional view of the electrical connector in the open state along C-C according to the second embodiment of the present invention.
Figure 19:
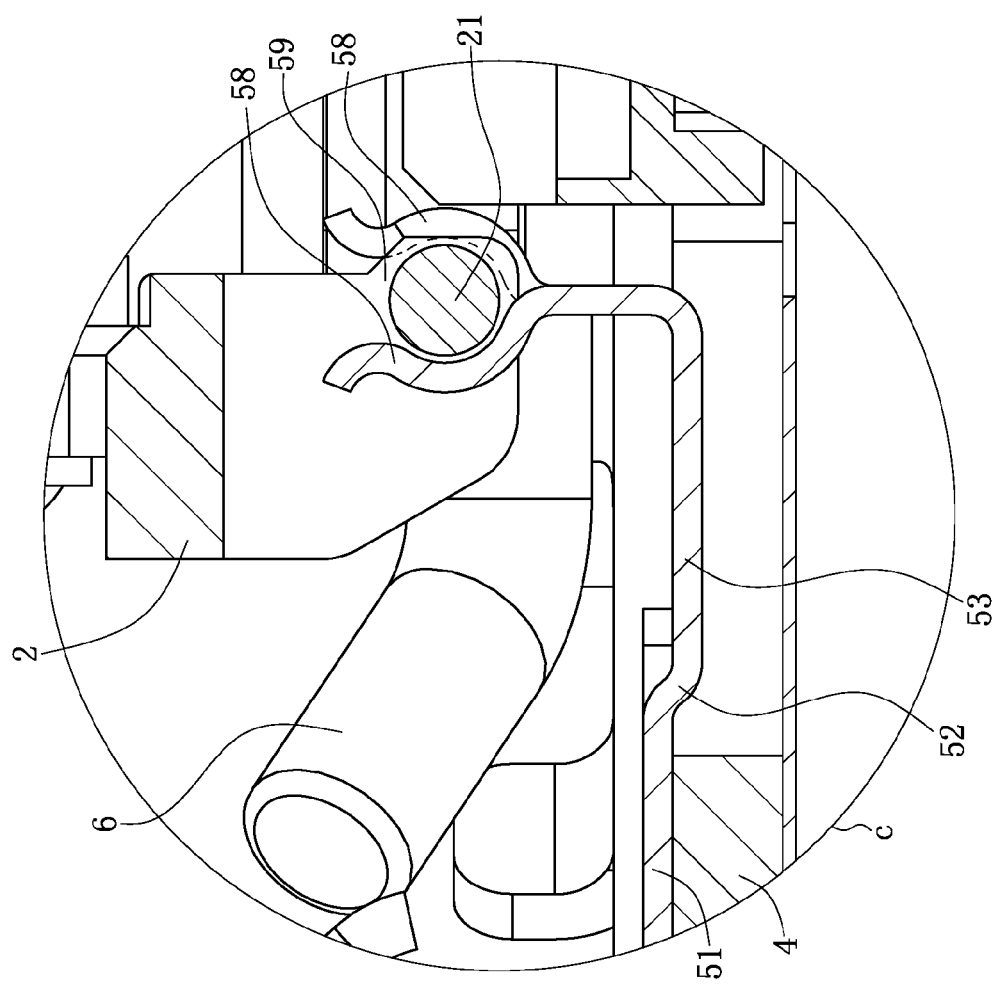
FIG. 19 is a local enlarged view of a portion c in FIG. 18.
Figure 20:
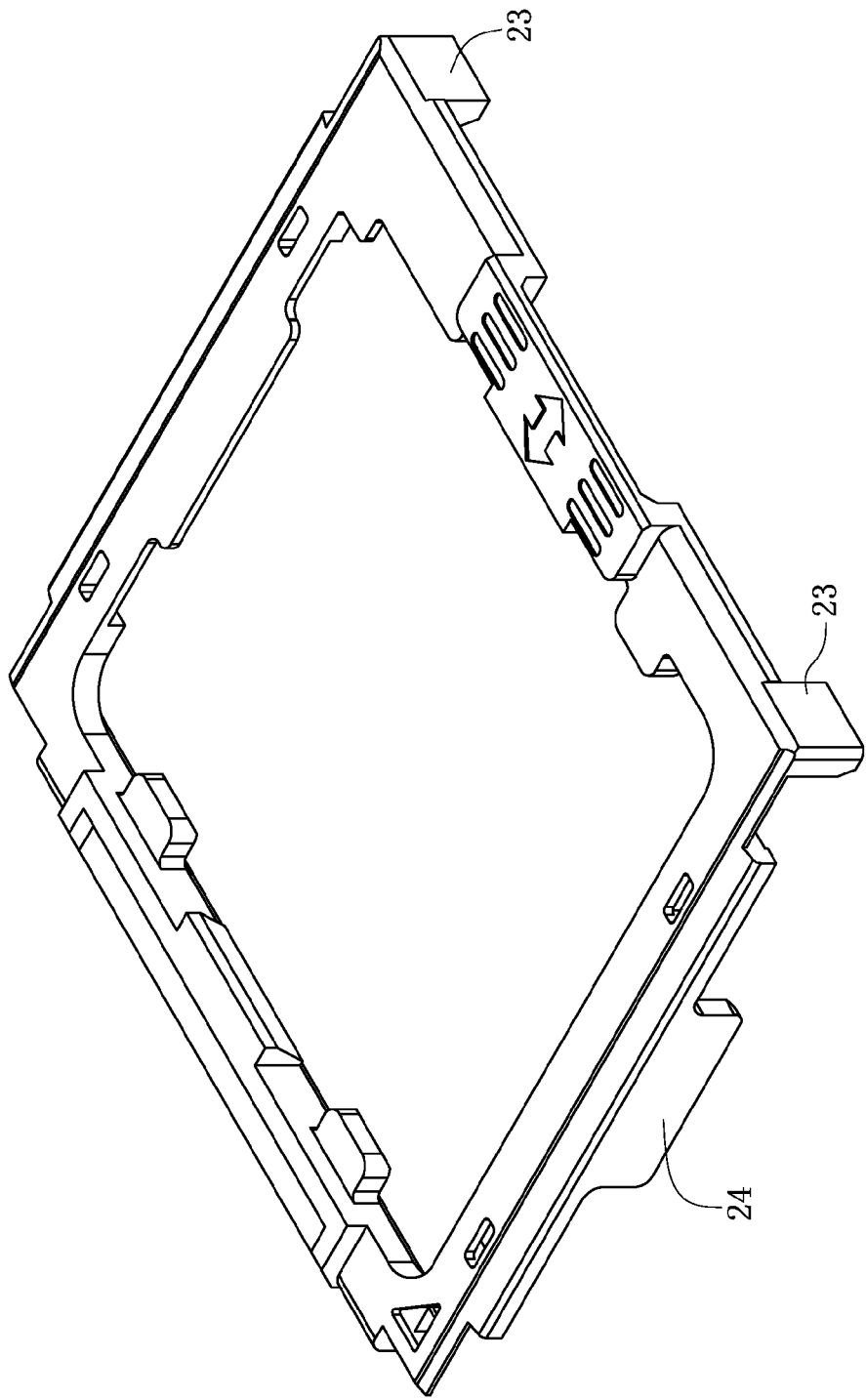
FIG. 20 is a structural schematic diagram of the electrical connector in which a carrier is provided with a first guide portion according to the present invention.
Figure 21:
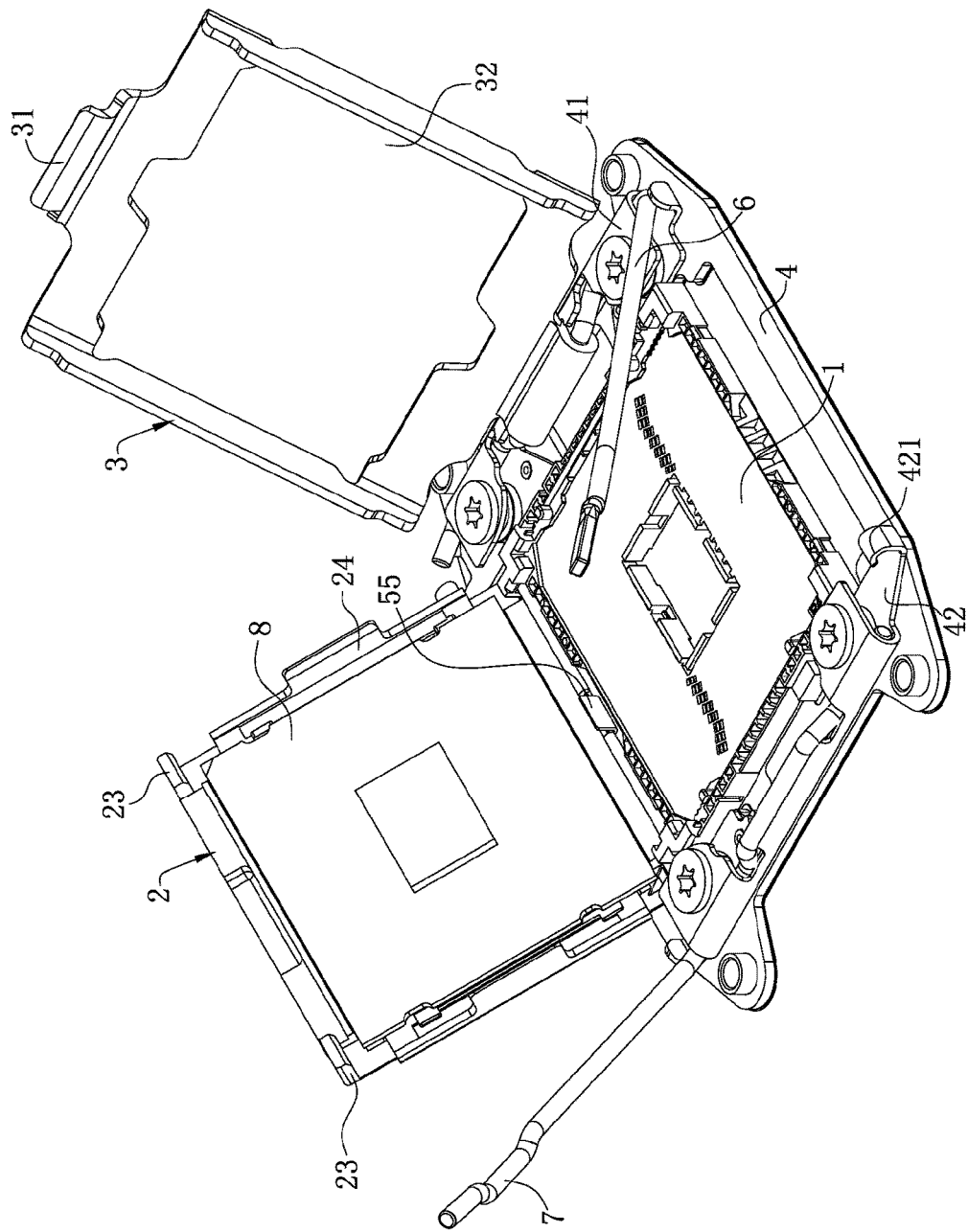
FIG. 21 is a three-dimensional assembled view of the electrical connector with the first guide portion according to the second embodiment of the present invention.

As shown in FIG. 13 and FIG. 14, the second embodiment of the present invention differs from the first embodiment in that: the carrying member 2 is provided with a pivoting shaft 21, and the pivoting shaft 21 has an assembly plane 25 and a stopping plane 26 which are adjacent to each other (as shown in FIG. 17). An elastic member 5 has a main body portion 51, the main body portion 51 is provided with multiple soldering portions 57, and the soldering portions 57 fix the elastic member 5 and the base 4. The main body portion 51 bends downward to form three bending portions 52, and two first elastic portions 53 and a second elastic portion 54 horizontally extend from the bending portions 52. The second elastic portion 54 is disposed between the two first elastic portions 53, and each of the first elastic portions 53 extend in a staggered manner to form two opposite limiting portions 58. Each limiting portion 58 has an arc surface, and the two opposite limiting portions 58 define a pivoting space 59 (as shown in FIG. 19). The pivoting shaft 21 is pivotally connected to the pivoting space 59 (as shown in FIG. 18 and FIG. 19). At least one buffer portion 55 bends upward from the second elastic portion 54, the buffer portion 55 is disposed between the insulating body 1 and the carrying member 2, and the assembly plane 25 or the stopping plane 26 presses against the buffer portion 55. A long side of the carrying member 2 away from the pivoting side has two first guide portions 23 (as shown in FIG. 20 and FIG. 21), and each first guide portion 23 has an oblique surface. The first guide portions 23 are matched with the outer wall of the insulating body 1, and guide the carrying member 2 to pivot to the insulating body 1. The first guide portions 23 and the second guide portion 24 can be arranged separately or can coexist, which is not further described herein.

Figure 15:
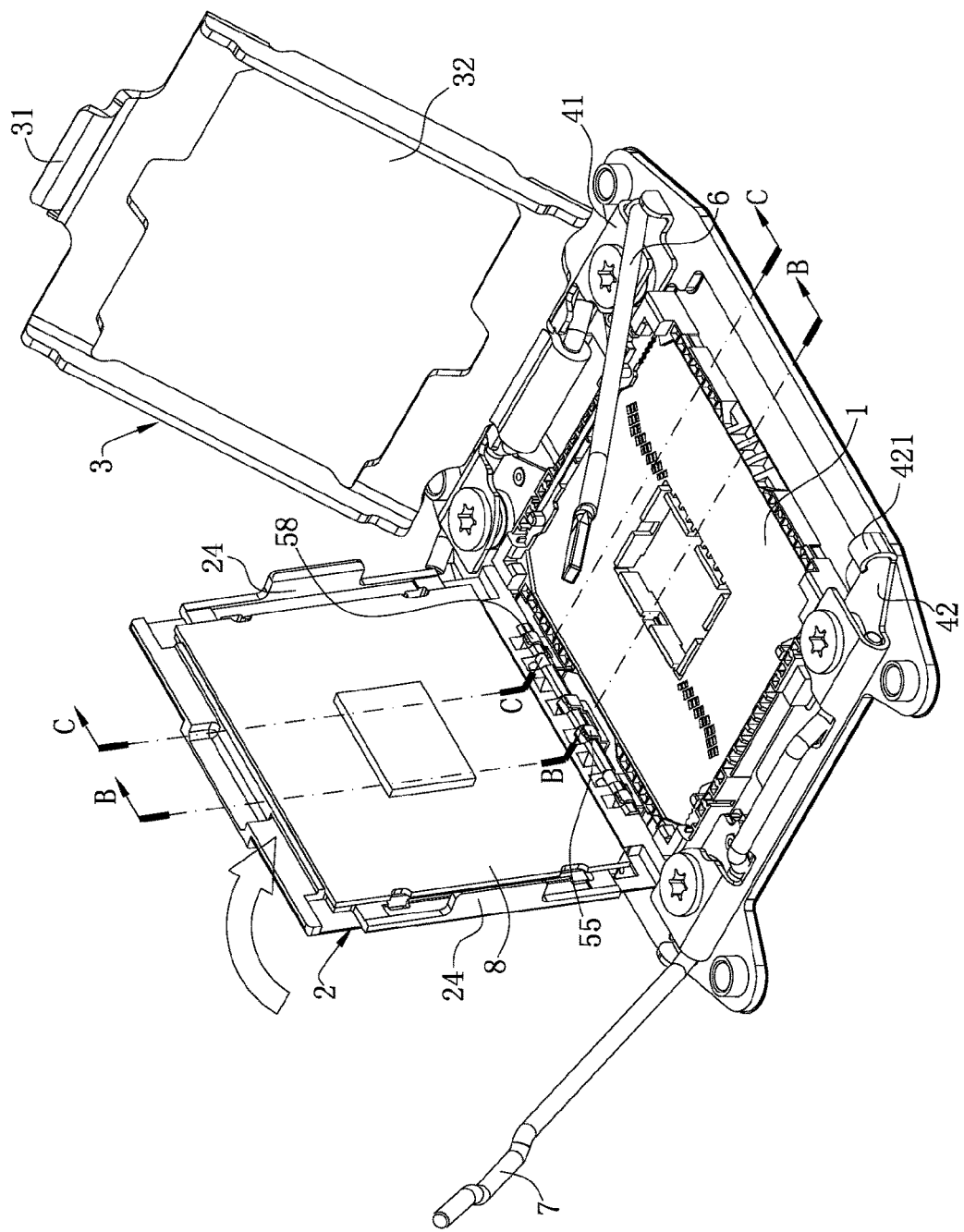
FIG. 15 is a three-dimensional assembled view of the electrical connector according to the second embodiment of the present invention.
Figure 16:
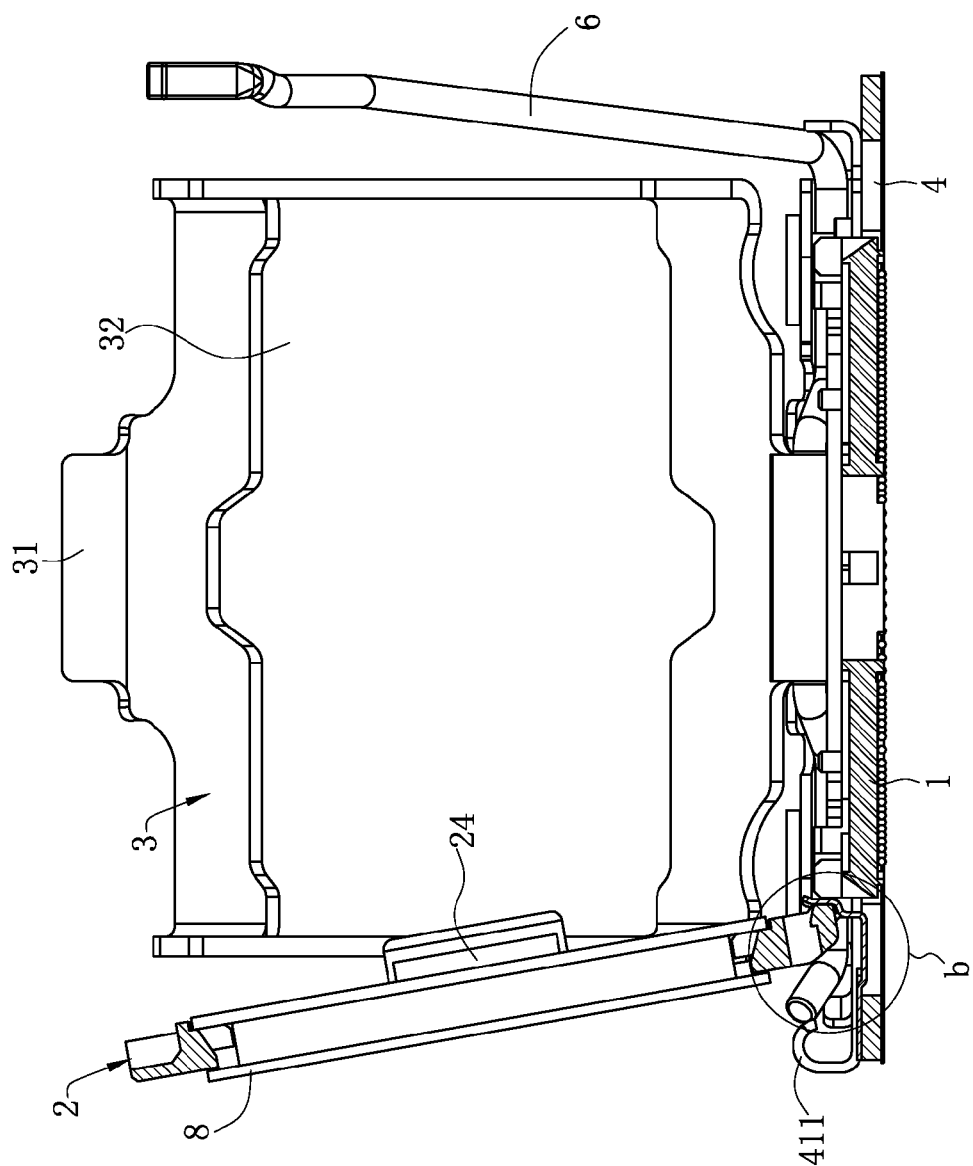
FIG. 16 is a local sectional view of the electrical connector in an open state along B-B according to the second embodiment of the present invention.

As shown in FIGS. 15 and 19, when assembling, the pivoting shafts 21 are pivotally connected to the pivoting space 59, and the chip module 8 is mounted into the carrying member 2. At this moment, the electrical connector is in an assembly state, and the assembly plane 25 abuts against the buffer portion 55 (as shown in FIG. 16 and FIG. 17). When the carrying member 2 carriers the chip module 8 to pivot downward, as the carrier member 2 presses downward, the assembly plane 25 rotates, and the plane abuts against the buffer portion transits from the assembly plane 25 to the stopping plane 26. When the stopping plane 26 abuts against the buffer portion 55, the buffer portion 55 stops the continuous motion of the carrying member 2, and at this moment, the electrical connector is in the buffer state, thereby preventing the carrying member 2 from suddenly pressing down and smashing the terminals 11. Then the pressing plate 3 is pressed down, and the pressing plate 3 downward presses the carrying member 2 or the chip module 8. The stopping plane 26 continues to press against the buffer portion 55 to deform the buffer portion 55, and at the same time, the first elastic portion 53 is stressed to generate elastic deformation, and an axis of the pivoting shaft 21 moves downward. Then, the second lever 7 is operated such that the second lever 7 is enabled to press the protruding portion 31, and the second lever 7 is hooked at the first hook portion 411. Then, the first lever 6 is operated such that the first lever 6 is hooked at the second hook portion 421, so that the electrical connector is in the closed state (as shown in FIG. 6). When the electrical connector is opened, the first lever 6 is first moved out of the second hook portion 421, then the second lever 7 is moved out of the first hook portion 411. At this moment, the carrying member 2 or the chip module 8 is not pressed by the pressing plate 3, the first elastic portion 53 vertically moves upward to return to the state before the elastic deformation, and the pivoting shafts 21 also return to positions before the pressing, i.e., the electrical connector returns to the buffer state, so that the electrical connector can be in the buffer state or the closed state at any time, and the chip module 8 is moved out of the insulating body 1 without damaging the terminals 11 on the insulating body 1.

To sum up, the electrical connector of the present invention has the following beneficial effects.

(1) In the electrical connector of the present invention, the carrying member 2 and the pressing plate 3 are arranged at two adjacent sides on the periphery of the insulating body 1, so that compared with the related art in which the carrying member 2 and the pressing plate 3 are arranged at the same side or two opposite sides of the insulating body 1, the length of the electrical connector need not increase, thereby enabling the electrical connector to occupy less space of the circuit board, saving the space on the circuit board, and being adaptive to the increasing miniaturization of electronic products today.

(2) One long side of the carrying member 2 is used as the pivoting side, so that the height of the center of gravity of the carrying member 2 is lowered; when the carrying member 2 carrying the chip module 8 is pressed down, the downward pressure of the carrying member 2 is reduced, and the buffer portion 55 is ensured to have sufficient buffer force to buffer the downward pressing of the carrying member 2, so that the carrying member 2 carrying the chip module 8 is prevented from directly smashing over the terminals 11 on the insulating body 1, thereby reducing the risk of operation errors.

(3) Each of two ends of the pivoting side of the carrying member 2 has one pivoting shaft 21, the pivoting shafts 21 are pivotally connected into the fixed holes 12, and the carrying member 2 can pivot without using other pivoting mechanisms, so that the electrical connector is simpler to assemble, and the cost is reduced.

(4) The buffer portion 55 extends upward from the second elastic portion 54, the buffer portion 55 is disposed between the insulating body 1 and the carrying member 2, the carrying member 2 is concavely provided with the matching portion 22 corresponding to the buffer portion 55. When the carrying member 2 pivots to the insulating body 1, the matching portion 22 presses against the buffer portion 55, and the buffer portion 55 applies a buffer force to the carrying member 2 to reduce the down pressure of the carrying member 2, so that the carrying member 2 stops moving, the carrying member 2 carrying the chip module 8 is prevented from directly smashing over the terminals 11 on the insulating body 1, and the risk of operation errors is reduced. And the buffer portion 55 stops the displacement of the carrying member 2, thereby ensuring the downward pressing accuracy of the carrying member 2.

(5) The main body portion 51 is provided with multiple soldering portions 57, and the soldering portions 57 fix the main body portion 51 onto the base 4. By adopting the laser soldering, the main body portion 51 and the base 4 are more firmly fixed. And as no soldering flux is needed, and other fixing structures are not used, more convenience and rapidness in soldering can be realized.

(6) A long side of the carrying member 2 away from the pivoting side is provided with the two first guide portions 23, and each of the two short sides of the carrying member 2 has one second guide portion 24. Each of the first guide portions 23 and the second guide portions 24 has an oblique surface, and the first guide portions 23 and the second guide portions 24 are matched with the outer wall of the insulating body 1, and guide the carrying member 2 to be pressed down to the insulating body 1, so that when the carrying member 2 pivots to the insulating body 1, the matching is more convenient and the positioning is more accurate.

(7) When the electrical connector is in a closed state and the pressing plate 3 presses the carrying member 2 or the chip module 8, the first elastic portion 53 is stressed to generate elastic deformation. When the electrical connector is opened, the carrying member 2 or the chip module 8 is not pressed by the pressing plate 3, and the first elastic portion 53 bounces to the state before the pressing, i.e., to the buffer state, so that the chip module 8 is moved out of the insulating body 1 without damaging the terminals 11 on the insulating body 1.

(8) In one embodiment, the first elastic portions 53 extend in a staggered manner to form two limiting portions 58, the two limiting portions 58 define a pivoting space 59, the carrying member 2 is pivotally connected to the pivoting space 59, and the carrying member 2 is enabled to pivot without using other pivoting mechanisms, so that the electrical connector is simpler to assemble, and the cost is also reduced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for bearing a chip module, comprising:
   an insulating body;
   a base fixed at the periphery of the insulating body;
   a plurality of terminals arranged in the insulating body;
   a carrying member, disposed at one side of the insulating body, adapted to carry the chip module to the insulating body, and configured to contact with the plurality of terminals;
   an elastic member fixed at the base and disposed at the same side with the carrying member; and
   a pressing plate, adapted to press the carrying member or the chip module,
   wherein the pressing plate and the carrying member are separately disposed at two adjacent sides on a periphery of the insulating body.

2. The electrical connector according to claim 1, wherein the carrying member has two opposite long sides and two opposite short sides, and one of the long sides of the carrying member is a pivoting side; and
   wherein the pressing plate has two opposite long sides and two opposite short sides, and one of the short sides of the pressing plate is a pivoting side.

3. The electrical connector according to claim 1, wherein the carrying member is pivotally connected to the insulating body.

4. The electrical connector according to claim 3, wherein each of two ends of a pivoting side of the carrying member has a pivoting shaft, the insulating body has two fixed holes, and pivoting shafts are pivotally connected to the fixed holes.

5. The electrical connector according to claim 1, wherein an elastic member and the carrying member are disposed at the same side of the insulating body, the elastic member has a buffer portion, and the buffer portion abuts against the carrying member.

6. The electrical connector according to claim 5, wherein the elastic member has a main body portion, the buffer portion extends from the main body portion, and the buffer portion is disposed between the insulating body and the carrying member.

7. The electrical connector according to claim 5, wherein the carrying member is concavely formed with a matching portion, and the matching portion abuts against the buffer portion.

8. The electrical connector according to claim 1, wherein an elastic member has a main body portion, at least one first elastic portion and at least one second elastic portion extend from the main body portion, and a buffer portion extends from the second elastic portion.

9. The electrical connector according to claim 8, wherein the elastic member further has
   at least one bending portion, bending downward from the main body portion, wherein the first elastic portion and the second elastic portion horizontally extend from the bending portion; and
   a bearing portion, bending upward from the first elastic portion, wherein the bearing portion upward abuts against the carrying member.

10. The electrical connector according to claim 8, wherein the number of the first elastic portion is two, and the second elastic portion is disposed between the two first elastic portions.

11. The electrical connector according to claim 1, wherein an elastic member has at least two limiting portions, the two limiting portions define a pivoting space, and the carrying member is pivotally connected to the pivoting space.

12. The electrical connector according to claim 11, wherein the two limiting portions are arranged in a staggered manner.

13. The electrical connector according to claim 11, wherein the elastic member has a main body portion, at least one first elastic portion and at least one second elastic portion extend from the main body portion, two limiting portions extend from the first elastic portion, and a buffer portion extends from the second elastic portion.

14. The electrical connector according to claim 13, wherein the elastic member further has at least one bending portion bending downward from the main body portion, the first elastic portion and the second elastic portion horizontally extend from the bending portion, the two limiting portions bend upward from the first elastic portion, and the buffer portion bends upward from the second elastic portion.

15. The electrical connector according to claim 13, wherein the carrying member has a pivoting shaft, the pivoting shaft has an assembly plane and a stopping plane adjacent to each other, when the carrying member is in an assembly state, the assembly plane abuts against the buffer portion, and when the carrying member is in a buffer state, the stopping plane abuts against the buffer portion.

16. The electrical connector according to claim 1, wherein two short sides of the carrying member have at least one second guide portion, and the at least one second guide portion is adapted to match with an outer wall surface of the insulating body and guide the carrying member to the insulating body.

17. The electrical connector according to claim 1, wherein the elastic member has a main body portion, the main body portion has a plurality of soldering portions, and the soldering portions fix the elastic member with the base.

18. The electrical connector according to claim 1, wherein a base is fixed on the periphery of the insulating body, a first reinforcing member and a second reinforcing member are fixed at the base, the second reinforcing member is disposed at an opposite side of the first reinforcing member, a first lever is pivotally connected to the first reinforcing member, a second lever is pivotally connected to the second reinforcing member, the pressing plate is pivotally connected to the first lever, the pressing plate has a protruding portion, and the second lever is adapted to press the protruding portion.

19. The electrical connector according to claim 1, wherein a side of the carrying member away from a pivoting side of the carrying member has at least one first guide portion, and the at least one first guide portion is adapted to match with an outer wall surface of the insulating body and guide the carrying member to the insulating body.

* * * * *